US011959951B2

(12) United States Patent
Halalchi et al.

(10) Patent No.: US 11,959,951 B2
(45) Date of Patent: Apr. 16, 2024

(54) METHOD FOR ESTIMATING THE INSULATION RESISTANCE OF A HIGH-VOLTAGE CIRCUIT IN AN ELECTRIC OR HYBRID MOTOR VEHICLE

(71) Applicant: RENAULT s.a.s., Boulogne-Billancourt (FR)

(72) Inventors: Houssem Halalchi, Paris (FR); Nicolas Vaflard, Paris (FR); Pierre-Mikael Viollin, Versailles (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 220 days.

(21) Appl. No.: 17/764,397

(22) PCT Filed: Sep. 21, 2020

(86) PCT No.: PCT/EP2020/076319
§ 371 (c)(1),
(2) Date: Mar. 28, 2022

(87) PCT Pub. No.: WO2021/063725
PCT Pub. Date: Apr. 8, 2021

(65) Prior Publication Data
US 2022/0349928 A1   Nov. 3, 2022

(30) Foreign Application Priority Data
Sep. 30, 2019 (FR) ........................................ 1910786

(51) Int. Cl.
*G01R 27/18* (2006.01)
*B60L 3/00* (2019.01)
(Continued)

(52) U.S. Cl.
CPC ............ *G01R 27/18* (2013.01); *B60L 3/0069* (2013.01); *G01R 27/08* (2013.01); *G01R 31/52* (2020.01)

(58) Field of Classification Search
CPC ...... G01R 27/18; G01R 27/08; G01R 27/025; B60Y 200/91; B60Y 200/92; B60L 3/0069
See application file for complete search history.

(56) References Cited

U.S. PATENT DOCUMENTS

| 6,058,325 | A | 5/2000 | Baura |
| 2006/0003198 | A1* | 1/2006 | Leitz .................... G01R 31/36 204/401 |

(Continued)

FOREIGN PATENT DOCUMENTS

| FR | 3 011 636 A1 | 4/2015 |
| FR | 3 037 406 A1 | 12/2016 |
| WO | WO 2011/160881 A1 | 12/2011 |

OTHER PUBLICATIONS

International Search Report dated Dec. 14, 2020 in PCT/EP2020/076319, filed on Sep. 21, 2020, 2 pages.
(Continued)

*Primary Examiner* — Dominic E Hawkins
(74) *Attorney, Agent, or Firm* — Oblon, McClelland, Maier & Neustadt, L.L.P.

(57) ABSTRACT

A method determines an insulation resistance of the high-voltage network in an electric or hybrid vehicle, in which a controllable continuous voltage source connected to the body and to a single first terminal of a high-voltage battery of the vehicle is provided, a first resistor being connected in series to the source between the single first terminal and the body and a second resistor being connected in series between the first resistor and the source, consecutive voltage setpoint values are applied between the body and the single
(Continued)

Figure 1:
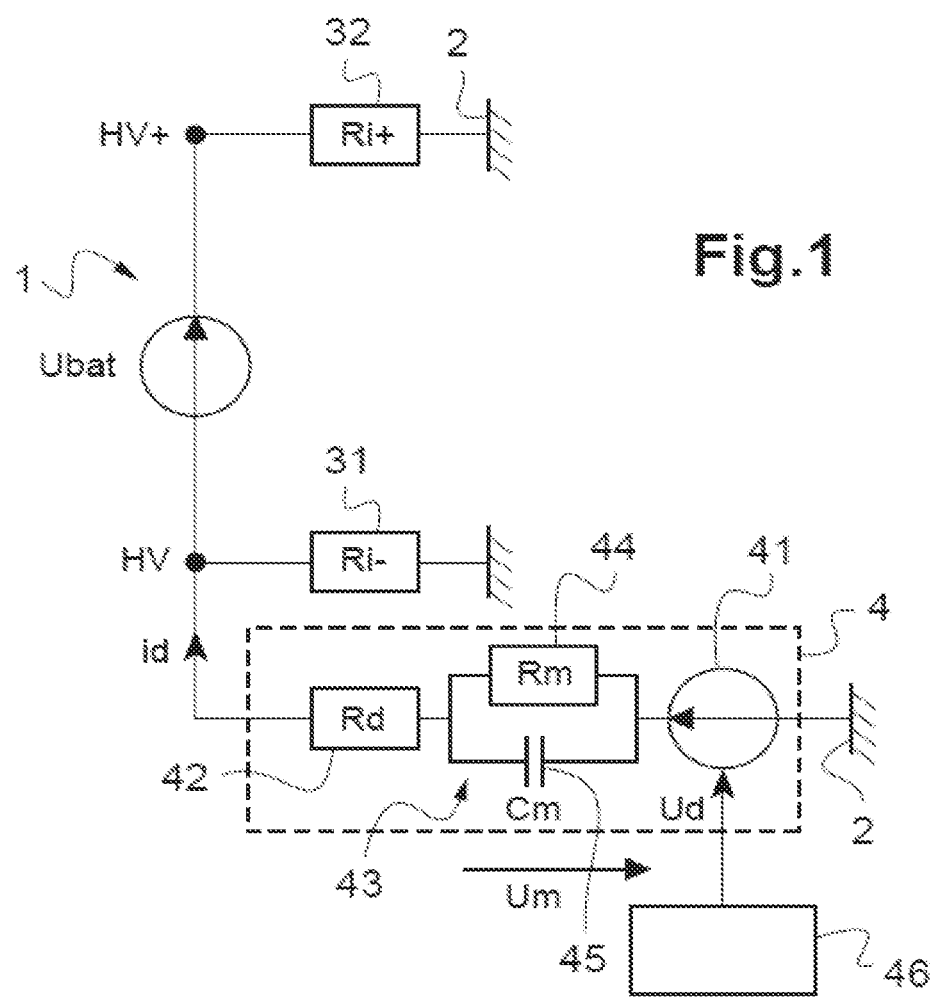

first terminal, a measurement signal of the voltage at the terminals of the second resistor is acquired for each setpoint value, adaptive filtering of the signal is carried out and an estimate made, in a recursive manner, of a vector of the filter transfer function coefficients, providing an update of the filtering coefficients, the insulation resistance being determined based on the estimate.

10 Claims, 2 Drawing Sheets

(51) Int. Cl.
    *G01R 27/08*     (2006.01)
    *G01R 31/52*     (2020.01)

(56) References Cited

U.S. PATENT DOCUMENTS

| | | |
|---|---|---|
| 2012/0119754 A1 | 5/2012 | Brenk et al. |
| 2018/0154776 A1 | 6/2018 | Gardien et al. |
| 2020/0064410 A1* | 2/2020 | Tong .................... G01R 31/389 |
| 2020/0144812 A1* | 5/2020 | Shin ..................... H01M 10/48 |
| 2020/0292623 A1* | 9/2020 | Jang .................... G01R 31/385 |

OTHER PUBLICATIONS

French Preliminary Search Report dated Jun. 4, 2020 in French Application 19 10786, filed on Sep. 30, 2019, 8 pages (with English Translation of Categories of Cited documents & Written Opinion).

* cited by examiner

METHOD FOR ESTIMATING THE INSULATION RESISTANCE OF A HIGH-VOLTAGE CIRCUIT IN AN ELECTRIC OR HYBRID MOTOR VEHICLE

The present invention relates to the field of electric or hybrid vehicles. The invention relates more particularly to a method for determining the insulation resistance between a point on a high-voltage circuit of an electric or hybrid vehicle comprising a high-voltage battery and the ground of the vehicle.

In electric or hybrid motor vehicles that have a traction chain equipped with at least one electric machine, this electric machine is used to provide the motor torque required to drive the vehicle. For that, electrical power is delivered to the electric machine by a high-voltage battery. The required voltage levels reach several hundred volts, typically around 400 volts. Such batteries also have a high capacity in order to further the range of the vehicle in electric mode. A number of technical reasons specific to the automotive application lead to the use of insulation between the body, or mechanical ground of the vehicle (formed by the metal chassis and metal bodywork of the vehicle, and therefore accessible to the user) and the potentials of the battery. Thus, any part of the vehicle electrically connected to the battery must be insulated from the ground. This insulation is achieved through the use of electrically insulating materials. However, the insulation is likely to deteriorate over time and therefore put the ground of the vehicle at a potential that is dangerous for the passengers of the vehicle or any person coming into contact with the vehicle.

That is why it is essential to check the insulation resistance between any point on the high-voltage circuit and the ground of the vehicle in order to prevent potential electric shocks for the passengers of the vehicle, or any person coming into contact with the vehicle. In particular, this monitoring may make it possible to correct a first insulation fault before a second insulation fault occurs. Specifically, only a double fault can create a short circuit, which is liable to cause the vehicle to break down.

This insulation resistance may be measured physically or estimated.

Physically measuring the insulation resistance requires that high voltages and current be injected at the insulation point being tested. However, it is necessary to be able to know the insulation resistance at any time, between any point on the high-voltage circuit of the vehicle and the ground of the vehicle, while still allowing the system to remain operational, in other words without it resulting in a traction or load interruption.

Thus, in the context of checking the insulation of the high-voltage network of electric and hybrid vehicles during their operation, obtaining the insulation resistance through estimation is preferred.

This estimate must be accurate enough so as never to be an overestimate, in order to allow reliable detection of any insulation faults, and not to be an underestimate, in order to avoid any false detection liable to lead to a breakdown of the vehicle.

Devices for detecting insulation faults for electric or hybrid vehicles are known in the prior art, these devices being based on resistive measurement circuits, in which a leakage current is measured using a voltage divider bridge formed of a plurality of resistors connected between the terminals of the battery. Such circuits have the drawback of needing to be connected to both terminals of the battery, which complicates their integration within the vehicle.

Document FR3037406 discloses a circuit for detecting an electrical insulation fault between the high-voltage battery of an electric vehicle and the body of the vehicle, forming an electrical ground of the vehicle. This detection circuit is electrically connected to the body and to a single first terminal of the battery, for example the negative terminal of the battery. An insulation fault typically manifests as the insulation resistance that connects a point on the battery, for example located between two adjacent cells of the battery and the body, having a value lower than a safety threshold. Thus, a potentially dangerous leakage current flows through this isolation resistance from this point on the battery to the body. The detection circuit according to the aforementioned document comprises a controllable DC voltage source, connected to the body on the one hand and to the single first terminal of the battery on the other hand, allowing various voltage values to be applied between the body and the single first terminal. The detection circuit also comprises a device for measuring the current incoming over the single first terminal of the battery and exiting through a point on the battery, exhibiting an insulation fault, this current then flowing through the insulation resistance to the body. Thus, the application of the voltage by the controllable voltage source gives rise to an electric current which passes through the measurement device and the insulation resistance. In this way, for each voltage value applied by the controllable voltage source, a measurement of this current is acquired, from which the value of the insulation resistance between the point in question on the battery and the body can be calculated.

However, the calculation of the value of the insulation resistance is relatively lengthy to implement according to this method. In particular, it is necessary to bias the body and the single first terminal of the battery at different potentials for a certain time, to reach a steady state in which the leakage current measurements may be carried out. The time required to obtain this steady state may be disadvantageous in the implementation of a reliable strategy for checking the insulation of the high-voltage network of the vehicle.

Thus, an object of the invention is to at least partially overcome this limitation.

To that end, the invention relates to a method for determining an insulation resistance between a point on a high-voltage battery of an electric or hybrid vehicle and the body of the vehicle, comprising steps of:

providing a controllable DC voltage source connected to the body and to a single first terminal of the battery, providing a first resistor connected in series with said voltage source between the single first terminal and the body, capable of limiting a current incoming over the single first terminal of the battery, providing a second resistor connected in series between the first resistor and said voltage source, providing a measurement device capable of measuring the voltage across the terminals of the second resistor, applying, by means of said voltage source, different successive voltage setpoint values between the body and the single first terminal of the battery, acquiring, by said measurement device, a voltage measurement signal representative of the measurements of the voltage across the terminals of said second resistor for each voltage setpoint value applied successively, calculating a value of the insulation resistance on the basis of said voltage measurement signal, the method being characterized in that it implements a step of adaptive filtering of the voltage measurement signal, and in that it comprises a step of estimating, in a recursive manner, a vector of the transfer function coefficients of the adaptive filter, providing an update of the filtering coefficients, the insulation resistance value being calculated on the basis of said estimate.

The application of the method of the invention makes it possible to optimize the speed of convergence of the method for determining the insulation resistance without increasing the calculation complexity.

Advantageously, the value of the insulation resistance is calculated by means of the following formula:

$$R_i = \frac{R_m}{\hat{\vartheta}(k)} - (R_d + R_m)$$

where Ri is the value of the insulation resistance, Rd is the value of the first resistor, Rm is the value of the second resistor and $\hat{\vartheta}(k)$ is the estimate of the vector of the transfer function coefficients of the adaptive filter.

Advantageously, the estimate of the vector of the transfer function coefficients of the adaptive filter is made by considering the transfer function of the input signal u(k) and of the output signal y(k) which are defined as follows:

$$u(k)=U_{d2}(k)-U_{d1}(k)=\Delta U_d(k)$$

$$y(k)=U_{m2}(k)-U_{m1}(k)=\Delta U_m(k)$$

where $U_{m1}(k)$ and $U_{m2}(k)$ correspond to the voltage values measured across the terminals of said second resistor for, respectively, the voltage setpoint values $U_{d1}(k)$ and $U_{d2}(k)$ successively applied by said voltage source.

Advantageously, the input signal of the filter transfer function is replaced with the input signal defined as follows:

$$u(k) = \Delta U_d(k) + \frac{(U_{bat2} - U_{bat1}) \cdot (U_{m1} \cdot U_{d2} - U_{m2} \cdot U_{d1})}{(U_{m2} \cdot U_{bat1} - U_{m1} \cdot U_{bat2})}$$

where $U_{bat1}$ and $U_{bat2}$ correspond to the total battery voltage values considered for, respectively, the voltage setpoint values successively applied by said voltage source, so as to take into account the variations in the total battery voltage in each iteration of applying a voltage setpoint value.

Preferably, the method comprises a step of calculating the position of the insulation resistance with respect to the single first terminal of the battery on the basis of said estimate.

Advantageously, the estimate of the vector of the transfer function coefficients of the adaptive filter is made by considering the transfer function of the input signal u(k) and of the output signal y(k) which are defined as follows:

$$u(k)=U_{bat}\cdot(U_{m2}-U_{m1})$$

$$y(k)=U_{m1}U_{d2}-U_{d1}U_{m2}$$

where $U_{m1}$ and $U_{m2}$ correspond to the voltage values measured across the terminals of said second resistor for, respectively, the voltage setpoint values $U_{d1}$ and $U_{d2}$ successively applied by said voltage source, et $U_{bat}$ being the total battery voltage.

Advantageously, the input signal of the filter transfer function is replaced with the input signal defined as follows:

$$u(k)=U_{m2}\cdot U_{bat1}-U_{m1}\cdot U_{bat2}$$

where $U_{bat1}$ and $U_{bat2}$ correspond to the total battery voltage values considered for, respectively, the voltage setpoint values successively applied by said voltage source, so as to take into account the variations in the total battery voltage in each iteration of applying a voltage setpoint value.

Advantageously, the filtering step is carried out by means of a recursive least squares algorithm.

Advantageously, the method comprises the use of a single filtering setting parameter, said setting parameter representing the forgetting factor of the filter, consisting of a real coefficient between the values 0 and 1.

The invention also relates to a device for determining an insulation resistance between a point on a high-voltage battery (1) of an electric or hybrid vehicle and the body of the vehicle, comprising a detection circuit for detecting an insulation fault between the battery and the body, the detection circuit comprising a controllable DC voltage source, capable of applying a voltage setpoint between a single first terminal of the battery and the body, a first resistor connected in series with said voltage source between the single first terminal and the body, capable of limiting a current incoming over the single first terminal of the battery, a second resistor connected in series between the first resistor and said voltage source and a measurement device capable of measuring the voltage across the terminals of the second resistor, the device comprising a control unit capable of controlling the application, by means of said voltage source, of different successive voltage setpoint values between the body and the single first terminal of the battery, of acquiring, by said measurement device, a voltage measurement signal representative of the measurements of the voltage across the terminals of said second resistor for each voltage setpoint value applied successively, and of calculating a value of the insulation resistance on the basis of said voltage measurement signal, characterized in that said control unit comprises an adaptive filtering module for implementing the adaptive filtering processing according to the method as described above.

Figure 2:
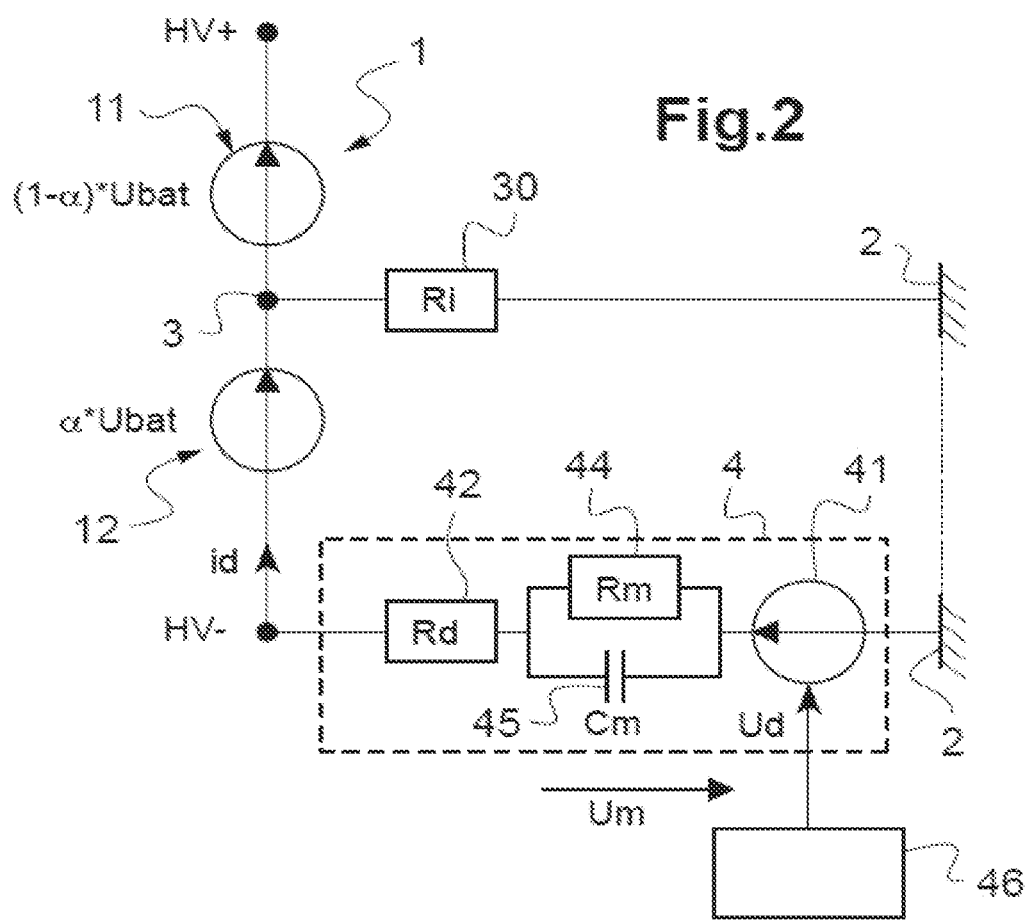

Other features and advantages of the present invention will become more clearly apparent from reading the following description, which is given by way of illustrative and non-limiting example with reference to the following single figure:

FIG. 1 schematically shows a circuit for detecting an insulation fault in the high-voltage battery of an electric or hybrid motor vehicle;

FIG. 2 schematically shows an insulation fault in the high-voltage battery of FIG. 1.

The following description relates to one exemplary embodiment of the invention in the context of application to the high-voltage electrical network of an electric or hybrid motor vehicle. With reference to FIG. 1, an electric or hybrid motor vehicle comprises a rechargeable high-voltage battery 1 as a high-voltage electricity source on board the vehicle. The battery 1 comprises two terminals, respectively a positive terminal HV+ and a negative terminal HV−. The battery 1 consists of a set of cells connected in series between the two terminals of the battery HV− and HV+. The battery 1 is designed to deliver a DC voltage $U_{bat}$ whose value remains constant over time. In this example, the battery voltage $U_{bat}$ is equal to 400 V.

Connected to the terminals HV+ and HV− of the battery is an electrical load (not shown) comprising an inverter and an electric machine for propelling the vehicle. The inverter converts the battery voltage $U_{bat}$ into an AC supply voltage for the electric machine. The vehicle also comprises a body 2, formed by the chassis and bodywork of the vehicle, which are generally made of metal. This body constitutes the electrical ground for the vehicle, to which electric charge can flow in the event of an insulation fault at a point on the high-voltage battery of the vehicle.

What is meant here by insulation fault is the abnormal presence of an electrical contact of low electrical resistance between the body 2 of the vehicle and a point of electrical potential on the battery, such as one of the terminals HV+, HV− of the battery. FIG. 1 illustrates the electrical resistances 31, 32, which have a value denoted by Ri+ and Ri−, respectively, between the body 2 of the vehicle and each of the respective terminals HV+ and HV− of the battery. The value of such a resistance is said to be low if it is lower than or equal to a predefined safety threshold, for example 100 kΩ. Typically, in the absence of an insulation fault, the resistance between, on the one hand, the body 2 and, on the other hand, the terminals HV+ and HV− and, more generally, any point of potential on the battery 1, is higher than 100 kΩ or 1 MΩ. Alternatively, this resistor may be modeled as a resistance of infinite value. Because of this high resistance value, no potentially dangerous leakage current flows between the battery 1 and the body 2.

FIG. 2 illustrates a single insulation fault between a point 3 on the battery 1 and the body 2. This insulation fault manifests here as the insulation resistance 30, which connects this point 3 and the body 2, having a value, denoted by $R_i$, that is lower than the safety threshold. A potentially dangerous leakage current then flows through this resistor 30 from the battery 1 to the body 2. Such a leakage current is undesirable and may endanger a user of the vehicle who might come into direct contact with the body 2. For example, the point 3 is located between two adjacent cells of the battery 1. The battery 1 may then be likened to two DC voltage sources 11 and 12, connected in series with one another between the terminals HV+ and HV−, on either side of the point 3. The sources 11, 12 deliver, between their terminals, voltages $(1-\alpha)*U_{bat}$ and $\alpha*U_{bat}$, respectively, where the coefficient α is a real number within the range [0; 1]. Knowing the coefficient α makes it possible to know the position of the insulation fault in the battery 1. Thus, the insulation resistance, indicating the state of insulation of the battery, is located at a position a with respect to the terminal HV− of the battery and at a position (1−α) with respect to the terminal HV+.

As shown in FIGS. 1 and 2, the vehicle further comprises a circuit 4 for detecting such an insulation fault between the high-voltage battery 1 and the body 2 of the vehicle. The detection circuit 4 is electrically connected between the body 2 and a single terminal of the battery 1, here the terminal HV−. In other words, the terminals of the detection circuit 4 are connected to the body 2 constituting the ground of the vehicle on the one hand and to the terminal HV− of the high-voltage battery 1 of the vehicle on the other hand.

The detection circuit 4 comprises a controllable DC voltage source 41, capable of applying a non-zero voltage setpoint $U_d$ to the circuit between the terminal HV− and the body, according to a control signal received from a control unit 46, in order to generate, if necessary, a difference in potential across the terminals of the insulation resistance 30 and consequently to cause an electric current $i_d$ to flow through this insulation resistance. The voltage setpoint value $U_d$ is preferably lower than or equal to 60 V, for example between 0 and 24 V.

The detection circuit 4 also comprises a first electrical resistor 42, called the limiting resistor 42, which is connected in series with the DC voltage source 41 between the terminal HV− of the battery and the body. More precisely, the limiting resistor 42 is connected between the terminal HV− and the DC voltage source 41. This limiting resistor 42 makes it possible to ensure better insulation between the battery 1 and the rest of the detection circuit 4, so as to prevent the value of the current $i_d$ from being too high and presenting a danger to a user. The value of this limiting resistor 42, denoted by $R_d$, is, for example, chosen so as to be as low as possible in order to facilitate the measurement of the current $i_d$ while being high enough so as not to damage the electrical insulation of the detection circuit 4. A value for $R_d$ will preferably be chosen that is higher, for example five times, or even 10 times, higher than a value $R_i$ of the abnormal insulation resistance which is, for example, of the order of 100 kΩ, for a voltage of 400 V, leading to a maximum acceptable current of 4 mA (the highest maximum acceptable current commonly accepted for the safety of persons is of order of 10 mA). For example, the value $R_d$ of the limiting resistor is thus equal to 500 kΩ.

The detection circuit 4 also comprises a device 43 for measuring the current that flows through the terminal HV− of the battery and the insulation resistance 30. The measurement device 43 comprises a second electrical resistor 44, called the measurement resistor 44, the value of which is denoted by $R_m$, which is connected between the DC voltage source 41 and the limiting resistor 42, in parallel with a capacitor 45 of capacitance Cm. In other words, the DC voltage source 41, the measurement resistor 44 and the limiting resistor 42 are connected in series between the body 2 and the terminal HV− of the battery. The measurement device 44 is capable of measuring the voltage $U_m$ across the terminals of the measurement resistor 44 when a voltage setpoint Ud is applied to the detection circuit 4 by the DC voltage source 41. Since the value $R_m$ of the measurement resistor 44 is known, measuring the voltage $U_m$ across the terminals of the measurement resistor 44 makes it possible to automatically deduce therefrom the value of the current $i_d$ that flows through the limiting resistor 42 to enter through the terminal HV− of the battery and then to flow through the insulation resistance 30 to the body 2.

Thus, the application of the voltage setpoint $U_d$ gives rise to an electric current $i_d$ which passes through the measurement device 43 and the limiting resistor 42.

Thus, to estimate the value $R_i$ of the insulation resistance 30, the control unit 46 is capable of controlling the successive application, by the DC voltage source 41, of a plurality of different voltage setpoint $U_d$ values, and then of acquiring, for each of the voltage setpoint values applied by the DC voltage source 41, the value of the corresponding current $i_d$, measured by the measurement device 43. The control unit is then able to automatically calculate the value $R_i$ of the insulation resistance 30 associated with the insulation fault located at the point 3 on the battery on the basis of the current $i_d$ values acquired and the voltage setpoint $U_d$ values applied.

For example, the DC voltage source 41 is controlled so as to successively apply two different voltage setpoint values, denoted by $U_{d1}$ and $U_{d2}$. Each of these voltage setpoint values $U_{d1}$ and $U_{d2}$ corresponds to a measurement value of the voltage across the terminals of the measurement resistor $R_m$, denoted by $U_{m1}$ and $U_{m2}$, respectively.

Thus, the value $R_i$ of the insulation resistance 30 and the position a of this insulation resistance with respect to the terminal HV− of the battery are calculated according to the following equations, assuming the total voltage of the battery $U_{bat}$ to be constant in each iteration of applying a voltage setpoint value:

$$R_i = R_m \cdot \frac{U_{d2} - U_{d1}}{U_{m2} - U_{m1}} - (R_d + R_m) \quad (1)$$

$$\alpha = \frac{U_{m1} U_{d2} - U_{d1} U_{m2}}{U_{bat} \cdot (U_{m2} - U_{m1})} \quad (2)$$

If it is desired to take account of variations in the voltage $U_{bat}$, these equations become:

$$R_i = \frac{R_m}{U_{m2} - U_{m1}} \cdot \left[ U_{d2} - U_{d1} + \frac{(U_{bat2} - U_{bat1}) \cdot (U_{m1} \cdot U_{d2} - U_{m2} \cdot U_{d1})}{(U_{m2} \cdot U_{bat1} - U_{m1} \cdot U_{bat2})} \right] - (R_d + R_m) \quad (3)$$

$$\alpha = \frac{U_{m1} U_{d2} - U_{d1} U_{m2}}{U_{m2} \cdot U_{bat1} - U_{m1} \cdot U_{bat2}} \quad (4)$$

With $U_{bat1}$ and $U_{bat2}$ the respective battery voltages considered for the successive applications of the two voltage setpoints $U_{d1}$ and $U_{d2}$.

Since the measurement of the voltage $U_m$ across the terminals of the measurement resistor $R_m$ is generally noisy, equations (1) and (2) or (3) and (4) are not used directly. In accordance with the invention, these equations are processed by two respective adaptive algorithms operating on the known recursive least squares (RLS) model, which are capable of providing a stable estimate of each of the two quantities $R_i$ and $\alpha$. Thus, the control unit of the detection circuit is capable of periodically providing the battery management system (BMS) with a reliable indication of the state of the electrical insulation of the traction system, allowing it to take the necessary measures if an insulation fault is observed.

An exemplary embodiment of this adaptive filtering by means of a recursive least squares (RLS) method will now be described in more detail for estimating the insulation resistance on the one hand, and for estimating the position of the insulation fault in the battery on the other hand.

First, the equations for implementing the RLS algorithm are recalled. Only the discrete case in which the signals are sampled, the index k representing the index of the current value of a quantity, will be considered hereinafter.

In general, this algorithm may be used to estimate the coefficients $a_i$ and $b_i$ of the discrete transfer function H(z) of the input signal u(k) and of the output signal y(k):

$$H(z) = \frac{Y(z^{-1})}{U(z^{-1})} = \frac{b_0 + b_1 \cdot z^{-1} + \ldots + b_N \cdot z^{-nb}}{1 + a_1 \cdot z^{-1} + \ldots + a_N \cdot z^{-na}} \quad (5)$$

Thus, it is a question of finding the "best" filter, that is to say the one that makes it possible to obtain at output the response y(k) that is the "closest" possible to a desired response when the input is a given sequence u(k). This adaptive filtering comprises recursive updating of the coefficients of the filter.

Thus, the algorithm starts from predetermined initial conditions and recursively modifies the coefficients of the filter in order to adapt to the process.

The main steps of each of the RLS algorithms are:

1. An initialization step: $0 < \lambda \leq 1$; $C(0)=C_0$; $\vartheta(0)=0$;
   C(k) is the covariance matrix of the input quantity of the algorithm, equal to $C_0$ at the initial time k=0. $\lambda$ is the forgetting factor parameter. $\vartheta(k)$ is the vector of the coefficients of the filter to be estimated, taken as equal to 0 at the initial time k=0.

2. A prediction step: $\hat{e}(k)=y(k)-\hat{y_k}=y(k)-X^T(k)\cdot \hat{\vartheta}(k-1)$;
   $\hat{e}(k)$ is the prediction error corresponding to the criterion to be minimized. In the present case, it is sought to minimize the difference between the current value y(k) of the signal produced at the output of the algorithm, and the result of the filtering, by the transfer function with the estimated coefficients $\hat{\vartheta}(k-1)$, of the past values of the signal. $X^T(k)$ represents the transpose vector of the vector X(k) defined as follows:

$$X(k)=[u(k)u(k-1) \ldots u(k-nb)-y(k-1) \ldots -y(k-na)]^T$$

and $$\vartheta(k)=[b_0 b_1 \ldots b_{nb} a_1 \ldots a_{na}]^T$$

3. A step of calculating the optimal gain: $L(k)=C(k-1)\cdot X(k)\cdot [\lambda+X^T(k)\cdot C(k-1)\cdot X(k)]^{-1}$ 4. A step of updating the estimate of the vector $\hat{\vartheta}(k)$ of the filter coefficients:

$$\hat{\vartheta}(k)=\hat{\vartheta}(k-1)+L(k)\cdot \hat{e}(k)$$

This adaptation of the coefficients of the filter is carried out on the basis of the prediction error, which therefore makes it possible to calculate an update of the filtering coefficients.

5. A step of updating the covariance matrix C(k):

$$C(k) = \frac{1}{\lambda}\left[C(k-1) - L(k) \cdot X^T(k) \cdot C(k-1)\right]$$

$$= \frac{1}{\lambda}\left[C(k-1) - \frac{C(k-1) \cdot X(k) \cdot X^T(k) \cdot C(k-1)}{\lambda + X^T(k) \cdot C(k-1) \cdot X(k)}\right]$$

In the steady state, in which the target impedance is purely resistive, equation (5) defined above becomes:

$$H(z)=b_0$$

In other words, the purpose of the adaptive algorithm is to provide an estimate of the vector of the coefficients of the filter, here consisting of the single parameter $\hat{\vartheta}(k)=b_0$, corresponding to the static gain $b_0$ of the transfer function H(z) of equation (5), in two different implementations of the adaptive algorithm in order to deduce therefrom the values $R_i$ and $\alpha$.

A first implementation is used to estimate the value $R_i$ of the insulation resistance. As mentioned above, two cases may arise depending on whether or not account is taken of variations in the battery voltage $U_{bat}$. Thus, in a first case in which the variations in the battery voltage $U_{bat}$ are ignored, the static gain $b_0$ of the transfer function H(z) of equation (5) is evaluated by considering the transfer function H(z) of the input signal u(k) and of the output signal y(k) which are defined as follows:

$$u(k)=U_{d2}(k)-U_{d1}(k)=\Delta U_d(k)$$

$$y(k)=U_{m2}(k)-U_{m1}(k)=\Delta U_m(k)$$

Hence the equation for updating the estimate $\hat{\vartheta}(k)$:

$$\hat{\vartheta}(k)=\hat{\vartheta}(k-1)+L(k)\cdot \hat{e}(k)$$

with: $\hat{e}(k)=\Delta U_m(k)-\Delta U_d(k)\cdot \hat{\vartheta}(k-1)$ $$L(k) = \frac{C(k-1) \cdot \Delta U_d(k)}{\lambda + C(k-1) \cdot (\Delta U_d(k))^2}$$

$$C(k) = \frac{1}{\lambda}\left[C(k-1) - \frac{(C(k-1))^2(\Delta U_d(k))^2}{\lambda + C(k-1) \cdot (\Delta U_d(k))^2}\right]$$

After convergence of the algorithm, there is obtained:

$$\hat{\vartheta}(k) = \frac{y(k)}{u(k)} = \frac{\Delta U_m(k)}{\Delta U_d(k)}.$$

Based on equation (1), the estimated insulation resistance $R_i$ is calculated as follows (7):

$$R_i = \frac{R_m}{\hat{\vartheta}(k)} - (R_d + R_m)$$

In a second case in which the variations in the battery voltage $U_{bat}$ are taken into account, the static gain $b_0$ of the transfer function H(z) of equation (5) is evaluated in the same way as for the first case, but with the following input signal being considered for the transfer function H(z):

$$u(k) = \Delta U_d(k) + \frac{(U_{bat2} - U_{bat1}) \cdot (U_{m1} \cdot U_{d2} - U_{m2} \cdot U_{d1})}{(U_{m2} \cdot U_{bat1} - U_{m1} \cdot U_{bat2})}$$

A second implementation of the adaptive algorithm is used to estimate the value α corresponding to the position of the insulation fault with respect to the terminal HV− of the battery. Like for estimating the value of the insulation resistance, two cases may arise depending on whether or not account is taken of variations in the battery voltage $U_{bat}$. Thus, in a first case in which the variations of the battery voltage $U_{bat}$ are ignored, steps 1. to 5. of the adaptive algorithm are implemented with an input signal u(k) and an output signal y(k) of the transfer function H(z) which are defined as follows:

$u(k) = U_{bat} \cdot (U_{m2} - U_{m1})$ and $y(k) = U_{m1}U_{d2} - U_{d1}U_{m2}$ After convergence of the algorithm, the estimate of the vector of the coefficients of the filter $\hat{\vartheta}(k)$ provides the estimate of the value α.

For the case in which the variations of the battery voltage $U_{bat}$ are taken into account, steps 1. to 5. of the adaptive algorithm for estimating $\hat{\vartheta}(k)$ are implemented this time with an input signal u(k) and an output signal y(k) of the transfer function H(z) which are defined as follows:

$u(k) = U_{m2} \cdot U_{bat1} - U_{m1} \cdot U_{bat2}$ and $y(k) = U_{m1}U_{d2} - U_{d1}U_{m2}$ Implementing the RLS-type adaptive algorithm, whether for estimating the value of the insulation resistance or for estimating the position of the insulation fault, has the advantage of having just one setting parameter. This setting parameter, representing the forgetting factor λ, is defined in the equations above. Its value, ranging between 0 and 1, makes it possible to give greater or lesser importance to the preceding samples in the covariance matrix. Its parameterization is therefore essential in order to optimize the speed of convergence of the algorithm while keeping the error to a minimum.

Another advantage of using the RLS-type adaptive algorithm to estimate the insulation resistance is that it allows computing costs to be optimized, as it does not require matrix inversion. Thus, it allows this estimation function to be integrated without having to increase the computing capabilities in the BMS and therefore without entailing any additional cost due to this still essential function.

To avoid instabilities, the updating of the estimate of the value of the insulation resistance $R_i$ is activated only if the following conditions are met:

$|\Delta U_m(k)| > \Delta U_{m\_min}$

This condition allows the algorithm to be made robust with respect to measurement noise and synchronization of the voltages $U_d$ and $U_m$ to be ensured, $\Delta U_m(k) \cdot \Delta U_m(k-1) \geq 0$ This condition allows the algorithm to be made robust with respect to sudden transitions.

$|\Delta U_{bat}(k)| < \Delta U_{bat\_max}$

This condition makes the algorithm robust with respect to variations in the total battery voltage.

The invention claimed is:

1. A method for determining an insulation resistance between a point on a high-voltage battery of an electric or hybrid vehicle and the body of the vehicle, comprising:
   providing a controllable DC voltage source connected to the body and to a single first terminal of the battery,
   providing a first resistor connected in series with said voltage source between the single first terminal and the body, configured to limit a current incoming over the single first terminal of the battery,
   providing a second resistor connected in series between the first resistor and said voltage source,
   providing a measurement device configured to measure the voltage across the terminals of the second resistor,
   applying, by said voltage source, different successive voltage setpoint values between the body and the single first terminal of the battery,
   acquiring, by said measurement device, a voltage measurement signal representative of the measurements of the voltage across the terminals of said second resistor for each voltage setpoint value applied successively,
   calculating a value of the insulation resistance based on said voltage measurement signal,
   adaptive filtering of the voltage measurement signal,
   estimating, in a recursive manner, a vector of the transfer function coefficients of the adaptive filter, and
   providing an update of the filtering coefficients, the insulation resistance value being calculated on the basis of said estimate.

2. The method as claimed in claim 1, wherein the value of the insulation resistance is calculated by the following formula:

$$R_i = \frac{R_m}{\hat{\vartheta}(k)} - (R_d + R_m)$$

where $R_i$ is the value of the insulation resistance, $R_d$ is the value of the first resistor, $R_m$ is the value of the second resistor and $\hat{\vartheta}(k)$ is the estimate of the vector of the transfer function coefficients of the adaptive filter.

3. The method as claimed in claim 2, wherein the estimate of the vector of the transfer function coefficients of the adaptive filter is made by considering the transfer function of the input signal u(k) and of the output signal y(k) which are defined as follows:

$$u(k)=U_{d2}(k)-U_{d1}(k)=\Delta U_d(k)$$

$$y(k)=U_{m2}(k)-U_{m1}(k)=\Delta U_m(k)$$

where $U_{m1}(k)$ and $U_{m2}(k)$ correspond to the voltage values measured across the terminals of said second resistor for, respectively, the voltage setpoint values $U_{d1}(k)$ and $U_{d2}(k)$ successively applied by said voltage source.

4. The method as claimed in claim 3, wherein the input signal of the filter transfer function is replaced with the input signal defined as follows:

$$u(k) = \Delta U_d(k) + \frac{(U_{bat2} - U_{bat1}) \cdot (U_{m1} \cdot U_{d2} - U_{m2} \cdot U_{d1})}{(U_{m2} \cdot U_{bat1} - U_{m1} \cdot U_{bat2})}$$

where $U_{bat1}$ and $U_{bat2}$ correspond to the total battery voltage values considered for, respectively, the voltage setpoint values successively applied by said voltage source, so as to take into account the variations in the total battery voltage in each iteration of applying a voltage setpoint value.

5. The method as claimed in claim 1, further comprising calculating the position of the insulation resistance with respect to the single first terminal of the battery on the basis of said estimate.

6. The method as claimed in claim 5, wherein the estimate of the vector of the transfer function coefficients of the adaptive filter is made by considering the transfer function of the input signal u(k) and of the output signal y(k) which are defined as follows:

$$u(k)=U_{bat} \cdot (U_{m2}-U_{m1})$$

$$y(k)=U_{m1}U_{d2}-U_{d1}U_{m2}$$

where $U_{m1}$ and $U_{m2}$ correspond to the voltage values measured across the terminals of said second resistor for, respectively, the voltage setpoint values $U_{d1}$ and $U_{d2}$ successively applied by said voltage source, and $U_{bat}$ being the total battery voltage.

7. The method as claimed in claim 6, wherein the input signal of the filter transfer function is replaced with the input signal defined as follows:

$$u(k)=U_{m2} \cdot U_{bat1}-U_{m1} \cdot U_{bat2}$$

where $U_{bat1}$ and $U_{bat2}$ correspond to the total battery voltage values considered for, respectively, the voltage setpoint values successively applied by said voltage source, so as to take into account the variations in the total battery voltage in each iteration of applying a voltage setpoint value.

8. The method as claimed in claim 1, wherein the filtering is carried out by a recursive least squares algorithm.

9. The method as claimed in claim 1, further comprising using a single filtering setting parameter, said setting parameter representing the forgetting factor of the filter, including a real coefficient between the values 0 and 1.

10. A device for determining an insulation resistance between a point on a high-voltage battery of an electric or hybrid vehicle and the body of the vehicle, comprising:
   a detection circuit for detecting an insulation fault between the battery and the body, the detection circuit comprising a controllable DC voltage source, configured to apply a voltage setpoint between a single first terminal of the battery and the body, a first resistor connected in series with said voltage source between the single first terminal and the body, configured to limit a current incoming over the single first terminal of the battery, a second resistor connected in series between the first resistor and said voltage source and a measurement device configured to measure the voltage across the terminals of the second resistor; and
   a control unit configured to controlling the application, by said voltage source, of different successive voltage setpoint values between the body and the single first terminal of the battery, of acquiring, by said measurement device, a voltage measurement signal representative of the measurements of the voltage across the terminals of said second resistor for each voltage setpoint value applied successively, and of calculating a value of the insulation resistance on the basis of said voltage measurement signal, wherein said control unit comprises an adaptive filtering module configured to implement the method as claimed in claim 1.

* * * * *